United States Patent
Gardner et al.

(10) Patent No.: US 6,905,904 B2
(45) Date of Patent: Jun. 14, 2005

(54) PLANAR OPTICAL WAVEGUIDE ASSEMBLY AND METHOD OF PREPARING SAME

(75) Inventors: Geoffrey Bruce Gardner, Sanford, MI (US); Randall Gene Schmidt, Midland, MI (US)

(73) Assignee: Dow Corning Corporation, Midland, MI (US)

(*) Notice: Subject to any disclaimer, the term of this patent is extended or adjusted under 35 U.S.C. 154(b) by 333 days.

(21) Appl. No.: 10/179,096

(22) Filed: Jun. 24, 2002

(65) Prior Publication Data

US 2003/0235383 A1 Dec. 25, 2003

(51) Int. Cl.[7] .............................................. H01L 27/14
(52) U.S. Cl. ........................ 438/31; 385/14; 385/130; 385/143
(58) Field of Search ............................ 438/31; 385/14, 385/130, 143

(56) References Cited

U.S. PATENT DOCUMENTS

| | | | | |
|---|---|---|---|---|
| 3,934,061 A | * | 1/1976 | Keck et al. | 427/163.2 |
| 4,904,037 A | * | 2/1990 | Imoto et al. | 385/14 |
| 4,939,065 A | | 7/1990 | Cavezzan et al. | 430/167 |
| 5,080,962 A | * | 1/1992 | Hench | 428/218 |
| 5,519,803 A | * | 5/1996 | Shiono et al. | 385/132 |
| 5,972,516 A | * | 10/1999 | Kaneko et al. | 428/429 |
| 6,088,492 A | | 7/2000 | Kaneko et al. | 385/14 |
| 6,415,093 B1 | * | 7/2002 | Nakamura et al. | 385/141 |

FOREIGN PATENT DOCUMENTS

| | | |
|---|---|---|
| EP | 118884 | 3/1984 |
| EP | 1 154 323 A1 | 11/2001 |
| JP | 10-148729 A | 11/1996 |
| JP | 09-124793 | 5/1997 |
| JP | 20001-90643 | 6/2000 |
| WO | WO 02/067292 | 8/2002 |

OTHER PUBLICATIONS

Pending patent application, "Semiconductor Package and Method of Preparing Same," Becker et. al., Dow Corning Corporation, Application No. 789083, Application date Feb. 20, 2002.

* cited by examiner

Primary Examiner—George Fourson
Assistant Examiner—Joannie Adelle Garcia
(74) Attorney, Agent, or Firm—Larry A. Milco

(57) ABSTRACT

A method of preparing a planar optical waveguide assembly, comprising the steps of (i) applying a curable polymer composition to a surface of a substrate to form a polymer film; (ii) curing the polymer film to form a lower clad layer; (iii) applying a silicone composition to the lower clad layer to form a silicone film; (iv) exposing at least one selected region of the silicone film to radiation having a wavelength of from 150 to 800 nm to produce a partially exposed film having at least one exposed region and at least one non-exposed region; (v) removing the non-exposed region of the partially exposed film with a developing solvent to form a patterned film; and (vi) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core. A planar optical waveguide assembly prepared according to the method of the invention.

31 Claims, 1 Drawing Sheet

PLANAR OPTICAL WAVEGUIDE ASSEMBLY AND METHOD OF PREPARING SAME

The present invention relates to a method of preparing a planar optical waveguide assembly and more particularly to a method of preparing a planar optical waveguide assembly containing at least one silicone core. The present invention also relates to a planar optical waveguide assembly prepared by the method.

BACKGROUND OF THE INVENTION

Methods of preparing planar optical waveguides containing a silicone core are known in the art. For Example, U.S. Pat. No. 6,088,492 to Kaneko et al. discloses a method of producing an optical waveguide using a siloxane-containing polymer, comprising thermally polymerizing a solution for forming a siloxane-containing polymer film, the solution being added with a metal alkoxide on a substrate, to form an optical waveguide composed of the siloxane-containing polymer film containing metal.

Methods of preparing planar optical waveguides containing a silicone core are also disclosed in European Patent Application No. EP 1 118 884 A1 to Nakamura et al.; Japanese Patent Application No. 200180643 A to Toyoda et al.; Japanese Patent Application No. 09124793 A to Hayashida et al.; and Japanese Patent Application No. 10148729 A to Tomaru et al.

Although the aforementioned references disclose methods of preparing optical waveguides having a range of thermal and environmental properties, there is a continued need for a method of producing a planar optical waveguide assembly having superior thermal stability and moisture resistance.

SUMMARY OF THE INVENTION

The present invention is directed to a method of preparing a planar optical waveguide assembly, comprising the steps of:
  (i) applying a curable polymer composition to a surface of a substrate to form a polymer film;
  (ii) curing the polymer film to form a lower clad layer;
  (iii) applying a silicone composition to the lower clad layer to form a silicone film, wherein the silicone composition comprises:
    (A) an organopolysiloxane containing an average of at least two silicon-bonded alkenyl groups per molecule,
    (B) an organosilicon compound containing an average of at least two silicon-bonded hydrogen atoms per molecule in a concentration sufficient to cure the composition, and
    (C) a catalytic amount of a photoactivated hydrosilylation catalyst;
  (iv) exposing at least one selected region of the silicone film to radiation having a wavelength of from 150 to 800 nm to produce a partially exposed film having at least one exposed region and at least one non-exposed region;
  (v) removing the non-exposed region of the partially exposed film with a developing solvent to form a patterned film; and
  (vi) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core.

The present invention is also directed to an optical waveguide assembly prepared by the preceding method.

The present invention is further directed to a method of preparing a planar optical waveguide assembly, comprising the steps of:
  (i) applying a curable polymer composition to a surface of a substrate to form a polymer film;
  (ii) curing the polymer film to form a lower clad layer;
  (iii) applying a silicone composition to the lower clad layer to form a silicone film, wherein the silicone composition comprises:
    (A) an organopolysiloxane containing an average of at least two silicon-bonded alkenyl groups per molecule,
    (B) an organosilicon compound containing an average of at least two silicon-bonded hydrogen atoms per molecule in a concentration sufficient to cure the composition, and
    (C) a catalytic amount of a photoactivated hydrosilylation catalyst;
  (iv) exposing at least one selected region of the silicone film to radiation having a wavelength of from 150 to 800 nm to produce a partially exposed film having at least one exposed region and at least one non-exposed region;
  (v) heating the partially exposed film for an amount of time such that the exposed region is substantially insoluble in a developing solvent and the non-exposed region is soluble in the developing solvent;
  (vi) removing the non-exposed region of the heated film with the developing solvent to form a patterned film; and
  (vii) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core.

The present invention is still further directed to an optical waveguide assembly prepared by the immediately preceding method.

The method of the present invention is scaleable to a high throughput manufacturing process. Importantly, the method allows simultaneous fabrication of multiple waveguides on a single substrate. Additionally, the method employs conventional wafer fabrication techniques (e.g., coating, exposing, developing, curing) and equipment. Furthermore, the method uses a photopatternable silicone composition, thereby eliminating additional process steps, for example, applying a photoresist and etching, associated with use of a non-photopatternable polymer composition. Finally, the process of the instant invention has high resolution, meaning that the process transfers images from a photomask to the silicone film with good retention of critical dimensions.

The planar optical waveguide assembly of the present invention exhibits good thermal stability over a wide range of temperatures and good environmental resistance, particularly moisture resistance. Also, the waveguide assembly exhibits low birefringence and low transmission loss.

The optical waveguide assembly of the present invention can be used to fabricate components of optical integrated circuits, such as attenuators, switches, splitters, routers, filters, and gratings.

These and other features, aspects, and advantages of the present invention will become better understood with reference to the following description, appended claims, and accompanying drawing.

DETAILED DESCRIPTION OF THE INVENTION

As used herein, the term "planar optical waveguide assembly" refers to a waveguide assembly containing at least one core having a rectangular cross section. Also, as used herein, the "refractive index" of a substance is defined as the ratio of the velocity of light in a vacuum to the velocity of light in the substance at 23° C. for light having a wavelength of 589 nm.

A first method of preparing a planar optical waveguide assembly according to the present invention, comprises the steps of:

(i) applying a curable polymer composition to a surface of a substrate to form a polymer film;

(ii) curing the polymer film to form a lower clad layer;

(iii) applying a silicone composition to the lower clad layer to form a silicone film, wherein the silicone composition comprises:

(A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst;

(iv) exposing at least one selected region of the silicone film to radiation having a wavelength of from 150 to 800 nm to produce a partially exposed film having at least one exposed region and at least one non-exposed region;

(v) removing the non-exposed region of the partially exposed film with a developing solvent to form a patterned film; and (vi) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core.

A curable polymer composition is applied to a surface of a substrate to form a polymer film. The curable polymer composition can be any polymer composition that cures in step (ii) to form a lower clad layer having a refractive index less than the refractive index of the silicone core. The cure mechanism of the polymer composition is not limited. The polymer composition can be cured, for example, by a condensation or addition reaction. Examples of curable polymer compositions include, but are not limited to, curable silicone compositions, such as hydrosilylation-curable silicone compositions, condensation-curable silicone compositions, and peroxide-curable silicone compositions; curable polyolefin compositions such as polyethylene and polypropylene compositions; curable polyamide compositions; curable epoxy resin compositions; curable amino resin compositions; curable polyurethane compositions; curable polyimide compositions; curable polyester compositions; and curable acrylic resin compositions.

In one embodiment of the method, the curable polymer composition is the silicone composition of the present invention, wherein the silicone composition cures to form a lower clad layer having a refractive index less than the refractive index of the silicone core. For example, the silicone core can be prepared using a silicone composition comprising a vinyl-terminated poly(methylphenylsiloxane) whereas the lower clad layer can be prepared using a silicone composition containing a vinyl-terminated polydimethylsiloxane.

The substrate can be a rigid or flexible material. Examples of substrates include, but are not limited to, a semiconductor material such as silicon, silicon having a surface layer of silicon dioxide, and gallium arsenide; quartz; fused quartz; aluminum oxide; polyolefins such as polyethylene and polypropylene; fluorocarbon polymers such as polytetrafluoroethylene and polyvinylfluoride; polystyrene; polyamides such as Nylon; polyimides; polyesters and acrylic polymers such as poly(methyl methacrylate); epoxy resins; polycarbonates; polysulfones; polyether sulfones; ceramics; and glass.

The curable polymer composition can be applied to the substrate using any conventional method, such as spin coating, dipping, spraying, brushing, or screen printing. The curable polymer composition is typically applied by spin coating at a speed of from 200 to 5000 rpm for 5 to 60 s. The spin speed, spin time, and viscosity of the curable polymer composition can be adjusted so that the lower clad layer produced in step (ii) has the desired thickness.

The polymer film is cured to form a lower clad layer. The polymer film can be cured by a variety of means, depending on the cure mechanism of the curable polymer composition, including exposure to ambient or elevated temperature, irradiation, and exposure to moisture.

The lower clad layer has a refractive index less than the refractive index of the silicone core. The magnitude of the difference in refractive index between the silicone core and the lower clad layer depends on several factors, including the thickness of the core, wavelength of propagated light, and mode of wave propagation (i.e., single mode or multimode). The difference in refractive index between the silicone core and the lower clad layer is typically from 0.0005 to 0.5, alternatively from 0.001 to 0.05, alternatively form 0.005 to 0.02. For example, a waveguide containing a silicone core having a thickness of 12 $\mu$m and a refractive index of 1.5, wherein the waveguide is capable of supporting the first four modes of propagation at a wavelength of 590 nm, has a difference in refractive index between the silicone core and the substrate of about 0.01. A waveguide containing a silicone core having a thickness of 7 $\mu$m and a refractive index of 1.5, wherein the waveguide is capable of supporting only single mode propagation at a wavelength of 590 nm, has a difference in refractive index between the silicone core and the lower clad layer of about 0.05.

Also, the lower clad layer typically has a thickness of from 5 to 200 $\mu$m, alternatively from 15 to 50 $\mu$m, alternatively from 20 to 35 $\mu$m.

A silicone composition is applied to the lower clad layer to form a silicone film, wherein the silicone composition comprises (A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst.

Component (A) is at least one organopolysiloxane containing an average of at least two silicon-bonded alkenyl groups per molecule. The organopolysiloxane can have a linear, branched, or resinous structure. The organopolysiloxane can be a homopolymer or a copolymer. The alkenyl groups typically have from 2 to about 10 carbon atoms, alternatively from 2 to 6 carbon atoms. Examples of alkenyl groups include, but are not limited to, vinyl, allyl, butenyl, and hexenyl. The alkenyl groups in the organopolysiloxane can be located at terminal, pendant, or both terminal and pendant positions. The remaining silicon-bonded organic groups in the organopolysiloxane are independently selected from hydrocarbyl, deuterium-substituted hydrocarbyl, and halogen-substituted hydrocarbyl, all free of aliphatic unsaturation. As used herein, the term "free of aliphatic unsaturation" means the groups do not contain an aliphatic carbon-carbon double bond or carbon-carbon triple bond. These monovalent groups typically have from 1 to about 20 carbon atoms, alternatively from 1 to 10 carbon atoms. Acyclic monovalent groups containing at least 3 carbon atoms can have a branched or unbranched structure.

Examples of hydrocarbyl groups include, but are not limited to, alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, decyl, undecyl, dodecyl, tridecyl, tetradecyl, pentadecyl, hexadecyl, heptadecyl, and octadecyl; cycloalkyl, such as cyclopentyl, cyclohexyl, and methylcyclohexyl; aryl, such as phenyl and naphthyl; alkaryl, such as tolyl and xylyl; and aralkyl, such as benzyl and phenethyl. Examples of deuterium-substituted hydrocarbyl groups include, but are not limited to, the hydrocarbyl groups listed above wherein at least one deuterium atom replaces an equal number of hydrogen atoms. Examples of halogen-substituted hydrocarbyl groups include, but are not limited to, 3,3,3-trifluoropropyl, 3-chloropropyl, dichlorophenyl, dibromophenyl, and 3,4,5,6-nonafluorohexyl.

The viscosity of the organopolysiloxane at 25° C., which varies with molecular weight and structure, is typically from 0.001 to 100,000 Pa·s, alternatively from 0.01 to 10,000 Pa·s, alternatively from 0.01 to 10,000 Pa·s.

Organopolysiloxanes useful in the silicone composition include, but are not limited to, polydiorganosiloxanes and organopolysiloxane resins. Examples of polydiorganosiloxanes include those having the following formulae: $ViMe_2SiO(Me_2SiO)_aSiMe_2Vi$, $ViMe_2SiO(Me_2SiO)_{0.25a}(MePhSiO)_{0.75a}SiMe_2Vi$, $ViMe_2SiO(Me_2SiO)_{0.95a}(Ph_2SiO)_{0.05a}SiMe_2Vi$, $ViMe_2SiO(Me_2SiO)_{0.98a}(MeViSiO)_{0.02a}SiMe_2Vi$, $Me_3SiO(Me_2SiO)_{0.095a}(MeViSiO)_{0.05a}SiMe_3$, and $PhMeViSiO(Me_2SiO)_aSiPhMeVi$, where Me, Vi, and Ph denote methyl, vinyl, and phenyl respectively and a has a value such that the viscosity of the polydiorganosiloxane is from 0.001 to 100,000 Pa·s at 25° C.

Methods of preparing polydiorganosiloxanes suitable for use in the silicone composition, such as hydrolysis and condensation of the corresponding organohalosilanes or equilibration of cyclic polydiorganosiloxanes, are well known in the art.

Examples of organopolysiloxane resins include an MQ resin consisting essentially of $R^2_3SiO_{1/2}$ units and $SiO_{4/2}$ units, wherein the mole ratio of $R^2_3SiO_{1/2}$ units to $SiO_{4/2}$ units is from 0.5 to 1.1; an MDQ resin consisting essentially of $R^2_3SiO_{1/2}$ units, $R^2_2SiO_{2/2}$ units, and $SiO_{4/2}$ units wherein the mole ratio of $R^2_3SiO_{1/2}$ units to $SiO_{4/2}$ units is from 0.5 to 1.1 and the mole ratio of $R^2_2SiO_{2/2}$ units to $R^2_3SiO_{1/2}$ units and $SiO_{4/2}$ units combined is from 0.01 to 0.3; an MT resin consisting essentially of $R^2_3SiO_{1/2}$ units and $R^1SiO_{3/2}$ units, wherein the mole ratio of $R^2_3SiO_{1/2}$ units to $R^1SiO_{3/2}$ units is from 0.05 to 1.0; an MTQ resin consisting essentially of $R^2_3SiO_{1/2}$ units, $R^1SiO_{3/2}$ units, and $SiO_{4/2}$ units, wherein the mole ratio of $R^2_3SiO_{1/2}$ units to $R^1SiO_{3/2}$ units is from 0.05 to 1.0 and the mole ratio of $SiO_{4/2}$ units to $R^2_3SiO_{1/2}$ units and $R_1SiO_{3/2}$ units combined is from 0.01 to 0.2; an MTD resin consisting essentially of $R^2_3SiO_{1/2}$ units, $R^1SiO_{3/2}$ units, and $R^2_2SiO_{2/2}$ units, wherein the mole ratio of $R^2_3SiO_{1/2}$ units to $R^1SiO_{3/2}$ units is from 0.05 to 1.0 and the mole ratio of $R^2_2SiO_{2/2}$ units to $R^2_3SiO_{1/2}$ units and $R_1SiO_{3/2}$ units combined is from 0.01 to 0.2; and a TD resin consisting essentially of $R^1SiO_{3/2}$ units and $R^2SiO_{2/2}$ units, wherein the mole ratio of $R^2SiO_{2/2}$ units to $R^1SiO_{3/2}$ units is from 0.02 to 1.0; wherein each $R^1$ is independently selected from hydrocarbyl, deuterium-substituted hydrocarbyl, and halogen-substituted hydrocarbyl, all free of aliphatic unsaturation, and $R^2$ is $R^1$ or alkenyl. The hydrocarbyl, deuterium-substituted hydrocarbyl, and halogen-substituted hydrocarbyl represented by $R^1$ and $R^2$, and the alkenyl groups represented by $R^2$ are as described an exemplified above for the organopolysiloxane, component (A).

MQ resins can be prepared by methods well-known in the art. For example, the resin can be prepared by treating a resin copolymer produced by the silica hydrosol capping process of Daudt et al. with at least an alkenyl-containing endblocking reagent. The method of Daudt et al, is disclosed in U.S. Pat. No. 2,676,182, which is hereby incorporated by reference to teach how to make organopolysiloxane resins suitable for use in the present invention.

Methods of preparing organopolysiloxane resins are well known in the art; many of these resins are commercially available. Organopolysiloxane resins are typically prepared by cohydrolyzing the appropriate mixture of chlorosilane precursors in an organic solvent, such as toluene. For example, a copolymer consisting essentially of $R^2_3SiO_{1/2}$ units and $R^1SiO_{3/2}$ units, can be prepared by cohydrolyzing a compound having the formula $R^2_3SiCl$ and a compound having the formula $R^1SiCl_3$ in toluene, where $R^1$ and $R^2$ are as defined above. The aqueous hydrochloric acid and silicone hydrolyzate are separated and the hydrolyzate is washed with water to remove residual acid and heated in the presence of a mild condensation catalyst to "body" the resin to the requisite viscosity. If desired, the resin can be further treated with a condensation catalyst in an organic solvent to reduce the content of silicon-bonded hydroxy groups. MDQ, MTQ, MTD, and TD resins can be similarly prepared by cohydrolysis and condensation of $R^2_3SiCl$, $R^2SiCl_2$, and $SiCl_4$; $R^2_3SiCl$, $R^1SiCl_3$, and $SiCl_4$; $R^2_3SiCl$, $R^1SiCl_3$, and $R^2SiCl_2$; and $R^2SiCl_2$ and $R^1SiCl_3$; respectively, where $R^1$ and $R^2$ are as defined above. Alternatively, silanes containing hydrolysable groups other than chloro, such —Br, —I, —OCH$_3$, —OC(O)CH$_3$, —N(CH$_3$)$_2$, NHCOCH$_3$, and —SCH$_3$, can be utilized as starting materials in the cohydrolysis reaction. The properties of the resin products depend on the types of silanes, the mole ratio of silanes, the degree of condensation, and the processing conditions.

Component (A) can be a single organopolysiloxane or a mixture comprising two or more organopolysiloxanes that differ in at least one of the following properties: structure, viscosity, average molecular weight, siloxane units, and sequence.

Component (B) is at least one organosilicon compound containing an average of at least two silicon-bonded hydrogen atoms per molecule. It is generally understood that crosslinking occurs when the sum of the average number of alkenyl groups per molecule in component (A) and the average number of silicon-bonded hydrogen atoms per molecule in component (B) is greater than four. The silicon-bonded hydrogen atoms in the organohydrogenpolysiloxane can be located at terminal, pendant, or at both terminal and pendant positions.

The organosilicon compound can be an organosilane or an organohydrogensiloxane. The organosilane can be a monosilane, disilane, trisilane, or polysilane. Similarly, the organohydrogensiloxane can be a disiloxane, trisiloxane, or polysiloxane. Preferably, the organosilicon compound is an organohydrogensiloxane and more preferably, the organosilicon compound is an organohydrogenpolysiloxane. The structure of the organosilicon compound can be linear, branched, cyclic, or resinous. Typically, at least 50 percent of the organic groups in the organosilicon compound are methyl.

Examples of organosilanes include, but are not limited to, monosilanes such as diphenylsilane and 2-chloroethylsilane; disilanes such as 1,4-bis(dimethylsilyl)benzene, bis[(p-dimethylsilyl)phenyl]ether, and 1,4-dimethyldisilylethane; trisilanes such as 1,3,5-tris(dimethylsilyl)benzene and 1,3,5-trimethyl-1,3,5-trisilane; and polysilanes such as poly(methylsilylene)phenylene and poly(methylsilylene)methylene.

Examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $H(CH_3)_2SiO_{1/2}$ units, $(CH_3)_3SiO_{1/2}$ units, and $SiO_{4/2}$ units.

Component (B) can be a single organosilicon compound or a mixture comprising two or more such compounds that differ in at least one of the following properties: structure, average molecular weight, viscosity, silane units, siloxane units, and sequence.

The concentration of component (B) in the silicone composition of the present invention is sufficient to cure (crosslink) the composition. The exact amount of component (B) depends on the desired extent of cure, which generally increases as the ratio of the number of moles of silicon-bonded hydrogen atoms in component (B) to the number of moles of alkenyl groups in component (A) increases. The concentration of component (B) is typically sufficient to provide from 0.5 to 3 silicon-bonded hydrogen atoms, alternatively from 0.7 to 1.2 silicon-bonded hydrogen atoms, per alkenyl group in component (A).

Methods of preparing organosilicon compounds containing silicon-bonded hydrogen atoms are well known in the art. For example, organopolysilanes can be prepared by reaction of chlorosilanes in a hydrocarbon solvent in the presence of sodium or lithium metal (Wurtz reaction). Organopolysiloxanes can be prepared by hydrolysis and condensation of organohalosilanes.

Component (C) is a photoactivated hydrosilylation catalyst. The photoactivated hydrosilylation catalyst can be any hydrosilylation catalyst capable of catalyzing the hydrosilylation of component (A) with component (B) upon exposure to radiation having a wavelength of from 150 to 800 nm and subsequent heating. The platinum group metals include platinum, rhodium, ruthenium, palladium, osmium and iridium. Preferably, the platinum group metal is platinum, based on its high activity in hydrosilylation reactions. The suitability of particular photoactivated hydrosilylation catalyst for use in the silicone composition of the present invention can be readily determined by routine experimentation using the methods in the Examples section below.

Examples of photoactivated hydrosilylation catalysts include, but are not limited to, platinum(II) β-diketonate complexes such as platinum(II) bis(2,4-pentanedioate), platinum(II) bis(2,4-hexanedioate), platinum(II) bis(2,4-heptanedioate), platinum(II) bis(1-phenyl-1,3-butanedioate, platinum(II) bis(1,3-diphenyl-1,3-propanedioate), platinum(II) bis(1,1,1,5,5,5-hexafluoro-2,4-pentanedioate); (η-cyclopentadienyl)trialkylplatinum complexes, such as (Cp)trimethylplatinum, (Cp)ethyldimethylplatinum, (Cp)triethylplatinum, (chloro-Cp)trimethylplatinum, and (trimethylsilyl-Cp)trimethylplatinum, where Cp represents cyclopentadienyl; triazene oxide-transition metal complexes, such as $Pt[C_6H_5NNNOCH_3]_4$, $Pt[p-CN-C_6H_4NNNOC_6H_{11}]_4$, $Pt[p-H_3COC_6H_4NNNOC_6H_{11}]_4$, $Pt[p-CH_3(CH_2)_x-C_6H_4NNNOCH_3]_4$, 1,5-cyclooctadiene.Pt[p-CN-C_6H_4NNNOC_6H_{11}]_2$, 1,5-cyclooctadiene.Pt[p-CH_3O-C_6H_4NNNOCH_3]_2$, $[(C_6H_5)_3P]_3Rh[p-CN-C_6H_4NNNOC_6H_{11}]$, and $Pd[p-CH_3(CH_2)_x-C_6H_4NNNOCH_3]_2$, where x is 1, 3, 5, 11, or 17; (η-diolefin)(σ-aryl)platinum complexes, such as ($η^4$-1,5-cyclooctadienyl)diphenylplatinum, $η^4$-1,3,5,7-cyclooctatetraenyl)diplenylplatinum, ($η^4$-2,5-norboradienyl)dipenylplatinum, ($η^4$-1,5-cyclooctadienyl)bis-(4-dimethylaminophenyl)platinum, ($η^4$-1,5-cyclooctadienyl)bis-(4-acetylphenyl)platinum, and ($η^4$-1,5-cyclooctadienyl)bis-(4trifluormethyl)platinum.

Component (C) can be a single photoactivated hydrosilylation catalyst or a mixture comprising two or more such catalysts.

The concentration of component (C) is sufficient to catalyze the addition reaction of components (A) and (B) upon exposure to radiation and heat in the method described below. The concentration of component (C) is typically sufficient to provide from 0.1 to 1000 ppm of platinum group metal, alternatively from 0.5 to 100 ppm of platinum group metal, alternatively from 1 to 25 ppm of platinum group metal, based on the combined weight of components (A), (B), and (C). The rate of cure is very slow below 1 ppm of platinum group metal. The use of more than 100 ppm of platinum group metal results in no appreciable increase in cure rate, and is therefore uneconomical.

Methods of preparing the preceding photoactivated hydrosilylation catalysts are well known in the art. For example, methods of preparing platinum(II) β-diketonates are reported by Guo et al. (Chemistry of Materials, 1998, 10, 531–536). Methods of preparing (η-cyclopentadienyl)trialkylplatinum complexes and are disclosed in U.S. Pat. No. 4,510,094. Methods of preparing triazene oxide-transition metal complexes are disclosed in U.S. Pat. No. 5,496,961. And, methods of preparing (η-diolefin)(σ-aryl)platinum complexes are taught in U.S. Pat. No. 4,530,879.

Mixtures of the aforementioned components (A), (B), and (C) may begin to cure at ambient temperature. To obtain a longer working time or "pot life", the activity of the catalyst under ambient conditions can be retarded or suppressed by the addition of a suitable inhibitor to the silicone composition of the present invention. A platinum catalyst inhibitor retards curing of the present silicone composition at ambient temperature, but does not prevent the composition from curing at elevated temperatures. Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes. Acetylenic alcohols constitute a preferred class of inhibitors in the silicone composition of the present invention.

The concentration of platinum catalyst inhibitor in the present silicone composition is sufficient to retard curing of the composition at ambient temperature without preventing or excessively prolonging cure at elevated temperatures. This concentration will vary widely depending on the particular inhibitor used, the nature and concentration of the hydrosilylation catalyst, and the nature of the organohydrogenpolysiloxane.

Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. The optimum concentration for a particular inhibitor in a given silicone composition can be readily determined by routine experimentation.

The silicone composition can also comprise additional ingredients, provided the ingredient does not adversely affect the photopatterning or cure of the composition in the method of the present invention. Examples of additional ingredients include, but are not limited to, adhesion promoters, solvents, inorganic fillers, photosensitizers, and surfactants.

The silicone composition can further comprise an appropriate quantity of at least one organic solvent to lower the viscosity of the composition and facilitate the preparation, handling, and application of the composition. Examples of suitable solvents include, but are not limited to, saturated hydrocarbons having from 1 to about 20 carbon atoms; aromatic hydrocarbons such as xylenes and mesitylene; mineral spirits; halohydrocarbons; esters; ketones; silicone fluids such as linear, branched, and cyclic polydimethylsiloxanes; and mixtures of such solvents. The optimum concentration of a particular solvent in the present silicone composition can be readily determined by routine experimentation.

The silicone composition can be a one-part composition comprising components (A) through (C) in a single part or, alternatively, a multi-part composition comprising components (A) through (C) in two or more parts. In a multi-part composition, components (A), (B), and (C) are typically not present in the same part unless an inhibitor is also present. For example, a multi-part silicone composition can comprise a first part containing a portion of component (A) and a portion of component (B) and a second part containing the remaining portion of component (A) and all of component (C).

The one-part silicone composition is typically prepared by combining components (A) through (C) and any optional ingredients in the stated proportions at ambient temperature with or without the aid of a solvent, which is described above. Although the order of addition of the various components is not critical if the silicone composition is to be used immediately, the hydrosilylation catalyst is typically added last at a temperature below about 30° C. to prevent premature curing of the composition. Also, the multi-part silicone composition can be prepared by combining the particular components designated for each part.

The silicone composition can be applied to the lower clad layer using any conventional method, such as spin coating, dipping, spraying, brushing, or screen printing. Typically, the silicone composition is applied by spin coating at a speed of from 200 to 5,000 rpm for 5 to 60 s. The spin speed, spin time, and viscosity of the silicone composition can be adjusted so that the silicone core produced in step (vi) has the desired thickness.

When the silicone composition comprises a solvent, the method can further comprise removing at least a portion of the solvent from the silicone film. The solvent can be removed by heating the silicone film at a temperature of from 50 to 150° C. for 1 to 5 min, alternatively from 80 to 120° C. for 2 to 4 min.

At least one selected region of the silicone film is exposed to radiation having a wavelength of from 150 to 800 nm, alternatively from 250 to 450 nm, to produce a partially exposed film having at least one exposed region and at least one non-exposed region. The light source typically used is a medium pressure mercury-arc lamp. The dose of radiation is typically from 0.1 to 5,000 mJ/cm$^2$, alternatively from 250 to 1,300 mJ/cm$^2$. The selected region of the silicone film is exposed to radiation through a photomask having a pattern of images.

The non-exposed region of the partially exposed film is removed with a developing solvent to form a patterned film. The developing solvent is an organic solvent in which the non-exposed region of the partially exposed film is at least partially soluble and the exposed region is essentially insoluble. The developing solvent typically has from 3 to 20 carbon atoms. Examples of developing solvents include ketones, such as methyl isobutyl ketone and methyl pentyl ketone; ethers, such as η-butyl ether and polyethylene glycol monomethylether; esters, such as ethyl acetate and γ-butyrolactone; aliphatic hydrocarbons, such as nonane, decalin, and dodecane; and aromatic hydrocarbons, such as mesitylene, xylene, and toluene. The developing solvent can be applied by any conventional method, including spraying, immersion, and pooling. For example, the developing solvent can be applied by forming a pool of the solvent on a stationary substrate and then spin-drying the substrate. The developing solvent is typically used at a temperature of from room temperature to 100° C. However, the specific temperature will depend on the chemical properties of the solvent, the boiling point of the solvent, the desired rate of pattern formation, and the requisite resolution of the photopatterning process.

The patterned film is then heated for an amount of time sufficient to form at least one silicone core having a refractive index of from to 1.3 to 1.7, alternatively from 1.4 to 1.7, alternatively from 1.4 to 1.6, at 23° C. for light having a wavelength of 589 nm. The patterned film is typically heated for an amount of time sufficient to achieve maximum crosslink density in the silicone without oxidation or decomposition. The patterned film is typically heated at a temperature of from 50 to 300° C. for 1 to 300 min, alternatively from 75 to 275° C. for 10 to 120 min, alternatively from 200 to 250° C. for 20 to 60 min. The patterned film can be heated using conventional equipment such as a hot plate or oven. The silicone core typically has a thickness (height) of from 1 to 100 μm, alternatively from 5 to 50 μm, alternatively from 8 to 20 μm.

The first method can further comprise (vii) covering the lower clad layer and the silicone core with a second curable polymer composition to form a second polymer film and (viii) curing the second polymer film to form an upper clad layer, wherein the upper clad layer has a refractive index less than the refractive index of the silicone core.

The second curable polymer composition can be any polymer composition that cures in step (viii) to form an upper clad layer having a refractive index less than the refractive index of the silicone core. The second curable polymer composition is as described and exemplified above for the curable polymer composition of step (i).

The second curable polymer composition can be applied to the silicone core and the substrate using any conventional method, such as spin coating, dipping, spraying, brushing, or screen printing. The curable polymer composition is typically applied by spin coating at a speed of from 200 to 5000 rpm for 5 to 60 s. The spin speed, spin time, and viscosity of the curable polymer composition can be adjusted so that the upper clad layer produced in step (viii) has the desired thickness.

The second polymer film can be cured by a variety of means, depending on the cure mechanism of the second curable polymer composition, including exposure to ambient or elevated temperature, irradiation, and exposure to moisture.

The upper clad layer has a refractive index less than the refractive index of the silicone core. The magnitude of the difference in refractive index between the silicone core and the upper clad layer is as described above for the difference in refractive index between the silicone core and the lower clad layer. Also, the upper clad layer typically has a thickness of from 5 to 200 $\mu$m, alternatively from 15 to 50 $\mu$m, alternatively from 20 to 35 $\mu$m.

A second method of preparing a planar optical waveguide assembly according to the present invention, comprises the steps of:

(i) applying a curable polymer composition to a surface of a substrate to form a polymer film;

(ii) curing the polymer film to form a lower clad layer;

(iii) applying a silicone composition to the lower clad layer to form a silicone film, wherein the silicone composition comprises:

(A) an organopolysiloxane containing an average of at least two silicon-bonded alkenyl groups per molecule, (B) an organosilicon compound containing an average of at least two silicon-bonded hydrogen atoms per molecule in a concentration sufficient to cure the composition, and (C) a catalytic amount of a photoactivated hydrosilylation catalyst;

(iv) exposing at least one selected region of the silicone film to radiation having a wavelength of from 150 to 800 nm to produce a partially exposed film having at least one exposed region and at least one non-exposed region;

(v) heating the partially exposed film for an amount of time such that the exposed region is substantially insoluble in a developing solvent and the non-exposed region is soluble in the developing solvent;

(vi) removing the non-exposed region of the heated film with the developing solvent to form a patterned film; and (vii) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core.

Steps (i), (ii), (iii), (iv), and (vii) of the second method are identical to steps (i), (ii), (iii), (iv) and (vi), respectively, of the first method.

The partially exposed film produced in step (iv) is heated for an amount of time such that the region exposed to radiation ("exposed region") is substantially insoluble in a developing solvent. The region that was not previously exposed to radiation ("non-exposed region") is soluble in the developing solvent. The term "substantially insoluble" means that the exposed region of the silicone film is not removed by dissolution in the developing solvent to the extent that the underlying surface of the substrate is exposed. The term "soluble" means that the unexposed region of the silicone film is removed by dissolution in the developing solvent, exposing the underlying surface of the substrate. The partially exposed film is typically heated at a temperature of from 50 to 250° C. for 0.1 to 10 min, alternatively from 100 to 200° C. for 1 to 5 min, alternatively from 135 to 165° C. for 2 to 4 min. The partially exposed film can be heated using conventional equipment such as a hot plate or oven.

The non-exposed region of the heated film produced in step (v) is removed with the developing solvent to form a patterned film. The developing solvent, method of applying the developing solvent, and temperature are as described in step (v) of the first method.

The second method can further comprise (viii) covering the lower clad layer and the silicone core with a second curable polymer composition to form a second polymer film and (ix) curing the second polymer film to form an upper clad layer, wherein the upper clad layer has a refractive index less than the refractive index of the silicone core. Steps (viii) and (ix) of the second method are identical to steps (vii) and (viii) of the first method.

Figure 1:
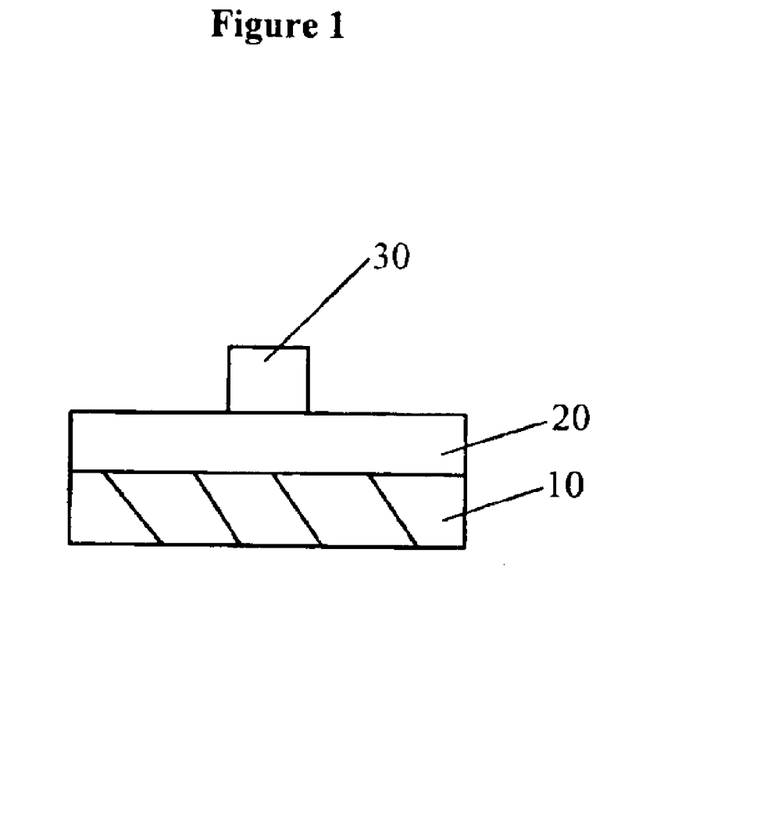
FIG. 1 shows a cross-sectional view of an embodiment of a planar optical waveguide assembly prepared according to the method of the present invention.

An embodiment of a planar optical waveguide assembly prepared by either the first or second method of the present invention is shown in FIG. 1. The optical waveguide assembly comprises a substrate 10, a lower clad layer 20 comprising a cured polymer composition covering a surface of the substrate 10, a silicone core 30 covering a portion of the lower clad layer 20, wherein the silicone core 30 has a refractive index of from 1.30 to 1.65 at 23° C. for light having a wavelength of 589 nm, and the lower clad layer 20 has a refractive index less than the refractive index of the silicone core 30.

Figure 2:
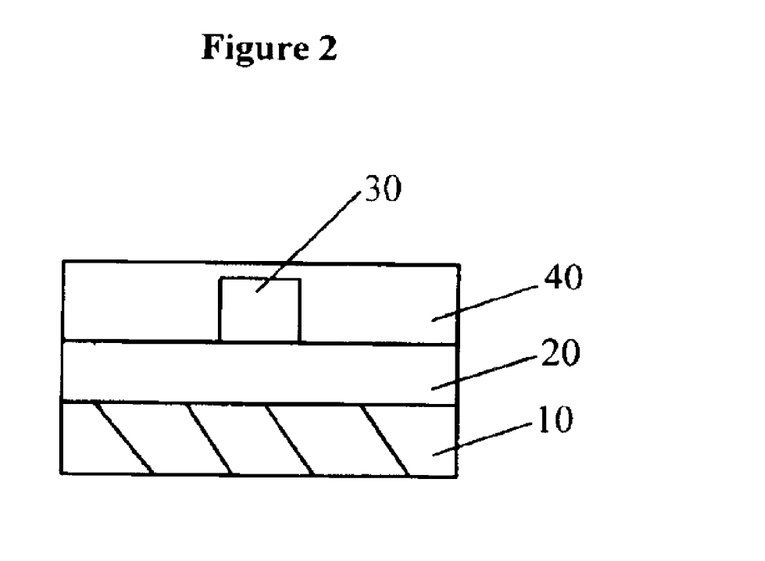
FIG. 2 shows a cross-sectional view of another second embodiment of a planar optical waveguide assembly prepared according to the method of the present invention.

Another embodiment of a planar optical waveguide assembly prepared by either the first or second method of the present invention is shown in FIG. 2. The optical waveguide assembly comprises a substrate 10, a lower clad layer 20 comprising a cured polymer 30 composition covering a surface of the substrate 10, a silicone core 30 covering a portion of the lower clad layer 20, wherein the silicone core 30 has a refractive index of from 1.30 to 1.65 at 23° C. for light having a wavelength of 589 nm, an upper clad layer 40 comprising a second cured polymer composition covering the lower clad layer 20 and the silicone core 30, wherein the lower clad layer 20 and the upper clad layer 40 each have a refractive index less than the refractive index of the silicone core 30.

The method of the present invention is scaleable to a high throughput manufacturing process. Importantly, the method allows simultaneous fabrication of multiple waveguides on a single substrate. Additionally, the method employs conventional wafer fabrication techniques (e.g., coating, exposing, developing, curing) and equipment. Furthermore, the method uses a photopatternable silicone composition, thereby eliminating additional process steps, for example, applying a photoresist and etching, associated with use of a non-photopatternable polymer composition. Finally, the process of the instant invention has high resolution, meaning that the process transfers images from a photomask to the silicone film on a substrate with good retention of critical dimensions.

The planar optical waveguide assembly of the present invention exhibits good thermal stability over a wide range of temperatures and good environmental resistance, particularly moisture resistance. Also, the waveguide assembly exhibits low birefringence and low transmission loss.

The optical waveguide assembly of the present invention can be used to fabricate components of optical integrated circuits, such as attenuators, switches, splitters, routers, filters, and gratings.

EXAMPLES

The following examples are presented to further illustrate the method of photopatterning the silicone composition of this invention, but are not to be considered as limiting the invention, which is delineated in the appended claims. Unless otherwise noted, all parts and percentages reported in the examples are by weight. The following methods and materials were employed in the examples:

Irradiation of a silicone film was carried out using a OAI 7-inch medium pressure mercury projection lamp equipped with a 4-inch diameter interference filter centered at 365 nm (I-line) and having a full width at half maximum (FWHM) of 10±2 nm (Optics Automation Instrumentation, Milpitas, Calif.). Radiation dose (mJ/cm$^2$) was measured using an International Light radiometer calibrated against I-line radiation.

Thickness of a cured silicone film on a silicon wafer was determined using a Tencor P-11 surface profilometer (KLA Tencor, Milpitas, Calif.). Film thickness was measured at a step between the coated and uncoated surfaces of the wafer. The reported value for thickness, in microns, represents the average of three measurements performed on different regions of the same wafer.

Film retention, expressed as percentage, was calculated according to the equation:

Film retention(%)=$t_2/t_1 \times 100$ where $t_2$ is the thickness of a cured patterned silicone film produced according to the method in the Examples below and $t_1$ is the thickness of a silicone film prepared using the same method, except omitting the steps of UV exposure, post-exposure heating, and developing (treatment with n-butyl ether). In the latter case, a portion of the unpatterned cured silicone film was removed to expose the wafer surface. Thickness measurements were carried out as described above.

Resolution of the photopatterning process was determined by measuring the size of a feature in the silicone film corresponding to a 250-micron circular aperture (Examples 1–3) or a 40-micron circular aperture (Examples 4–33) in the photomask. Measurements were performed on a digitized photomicrograph of the via using Image Pro Plus image analysis software (Silver Spring, Md.). The reported value for resolution, expressed in units of microns, represents the average of four measurements performed on different features of the same wafer.

Resin A: an organopolysiloxane resin consisting essentially of $CH_2=CH(CH_3)_2SiO_{1/2}$ units, $(CH_3)_3SiO_{1/2}$ units, and $SiO_{4/2}$ units, wherein the mole ratio of $CH_2=CH(CH_3)_2SiO_{1/2}$ units and $(CH_3)_3SiO_{1/2}$ units combined to $SiO_{4/2}$ units is about 0.7, and the resin has a weight-average molecular weight of about 22,000, a polydispersity of about 5, and contains about 5.5 mole percent (1.8% by weight) of vinyl groups.

Resin B: an organopolysiloxane resin consisting essentially of $PhSiO_{3/2}$ units and $CH_2=CH(CH_3)_2SiO_{1/2}$ units, wherein the mole ratio of $PhSiO_{3/2}$ units to $CH_2=CH(CH_3)_2SiO_{1/2}$ units is about 3.0, and the resin has a weight-average molecular weight of about 1600, has a polydispersity of about 1.14, and contains about 5.2 wt % of vinyl groups.

Crosslinking Agent A: a mixture consisting of 88% of a trimethylsiloxy-terminated poly(dimethylsiloxane/methylhydrogensiloxane) having an average of 92 dimethylsiloxane units and 6 methylhydrogensiloxane units and per molecule and containing about 0.08% of silicon-bonded hydrogen atoms; 4% of dimethyl methylhydrogen cyclosiloxane; 4% of octamethylcyclotetrasiloxane; 3% of decamethylcyclopentasiloxane; and 1% of dimethylcyclosiloxanes ($D_6$ or greater).

Crosslinking Agent B: an organohydrogenpolysiloxane resin consisting essentially of $PhSiO_{3/2}$ units and $H(CH_3)_2$ $SiO_{1/2}$ units, wherein the mole ratio of $PhSiO_{3/2}$ units to $H(CH_3)_2SiO_{1/2}$ units is about 1.2, and the resin has a viscosity of about 0.35 Pa·s, has a weight-average molecular weight of about 1250, and contains about 0.41 wt % of silicon-bonded hydrogen atoms.

Silicone Base: a mixture consisting of 61.32% of Resin A; 22.09% of a mixture consisting of 88% of a trimethylsiloxy-terminated poly(dimethylsiloxane/methylhydrogensiloxane) having an average of 100 dimethylsiloxane units and 9 methylhydrogensiloxane units per molecule and containing about 0.11% of silicon-bonded hydrogen atoms, 5% of dimethyl methylhydrogen cyclosiloxane, 3% of octamethylcyclotetrasiloxane, 2% of decamethylpentasiloxane, 1% of methylhydrogen cyclosiloxanes, and 0.8% of dimethylcyclosiloxanes ($D_6$ or greater); 2.33% of a trimethylsiloxy-terminated poly(dimethylsiloxane/methylhydrogensiloxane) having an average of 3 dimethylsiloxane units and 5 methylhydrogensiloxane units per molecule and containing about 0.8% of silicon-bonded hydrogen atoms; and 14.27% of mesitylene. The Silicone Base was stored in a sealed amber bottle.

The platinum(II) acetylacetonate used to prepare Catalysts A–E was obtained from Strem Chemicals (Newburyport, Mass.). The material was purified by sublimation at a temperature of 140° C. and a pressure of 4 mmHg.

Catalyst A: a mixture consisting of 0.05% of platinum(II) acetylacetonate in mesitylene.

Catalyst B: a mixture consisting of 0.10% of platinum(II) acetylacetonate in mesitylene.

Catalyst C: a mixture consisting of 0.15% of platinum(II) acetylacetonate in mesitylene.

Catalyst D: a mixture consisting of 0.20% of platinum(II) acetylacetonate in mesitylene.

Catalyst E: a mixture consisting of 0.25% of platinum(II) acetylacetonate in mesitylene.

Mesitylene: A.C.S. reagent grade.

Examples 1–3

Resin A (46.84 parts), 42.16 parts of Crosslinking Agent A, and 10.12 parts of mesitylene were combined in an amber bottle. Catalyst D (0.89 part) was added to the blend and mixing was continued for 0.5 h at room temperature. The mixture was then pressure-filtered (138 to 276 kPa nitrogen) through a stainless steel canister containing 10-µm and 5-µm nylon membranes in series. The silicone composition (filtrate) was stored prior to use at −15° C. in a closed polyethylene bottle wrapped in aluminum foil.

In each of Examples 1–3, the silicone composition (about 2.5 g), which was at room temperature, was applied to a 100-nm silicon wafer and spun out into a thin film (500 rpm for 10 s followed by 3000 rpm for 30 s). The coated wafer was heated on a hot plate at 110° C. for 2 min to remove most of the solvent. The film was then exposed to I-line radiation (365 nm) through a photomask containing 250-µm circular apertures and in near contact with the film. The wafer was then heated on a hot plate under the conditions of temperature and time specified in Table 1. The wafer was allowed to cool to room temperature and mounted on a spin coater. The coated surface of the wafer was flooded with nonane and allowed to stand at room temperature for 2 min. The wafer was then spun dry (500 rpm for 10 s followed by 3000 rpm for 30 s), placed in an oven for 30 min at 250° C., and allowed to cool to room temperature. The film thickness, film retention, and resolution values for each wafer are reported in Table 1.

TABLE 1

| Example | Catalyst | Dose (mJ/cm²) | Post. UV Temp. (° C.) | Bake Time (s) | Film Thickness (μm) | Film Retention (%) | Resolution (μm) |
|---|---|---|---|---|---|---|---|
| 1 | D | 1000 | 135 | 180 | 18.3 | 87 | 151 |
| 2 | D | 1000 | 144 | 265 | 16.8 | 80 | 168 |
| 3 | D | 1000 | 165 | 60 | 17.2 | 82 | 164 |

Examples 4–33

A silicone composition was prepared by combining the a silicone base with the Catalyst specified in Table 2 according to the following procedure: Silicone Base (99.15 parts) and 0.85 part of Catalyst were combined in an amber bottle and mixed for 0.5 h at room temperature. The mixture was then pressure-filtered (138 to 276 kPa nitrogen) through a stainless steel canister containing 10-μm and 5-μm nylon membranes in series. The silicone composition (filtrate) was stored prior to use at −15° C. in a closed polyethylene bottle wrapped in aluminum foil.

In each of Examples 4–33, a sample of the silicone composition (about 2.5 g), which was at temperature, was applied to a 100-mm silicon wafer and spun out into a thin film (500 rpm for 10 s followed by 3000 rpm for 30 s). The coated wafer was heated on a hot plate at 110° C. for 2 min to remove most of the solvent. The film was then exposed to I-line radiation (365 nm) through a photomask containing 40-μm circular apertures and in near contact with the film. The wafer was then heated on a hot plate under the conditions of temperature and time specified in Table 2. The wafer was allowed to cool to room temperature and mounted on a spin coater. The coated surface of the wafer was flooded with n-butyl ether and allowed to stand at room temperature for 2 min. The wafer was then spun dry (500 rpm for 10 s followed by 3000 rpm for 30 s), placed in an oven for 30 min at 250° C., and allowed to cool to room temperature. The film thickness, film retention, and resolution values for each wafer are reported in Table 2.

TABLE 2

| Example | Catalyst | Dose (mJ/cm²) | Post. UV Temp. (° C.) | Bake Time (s) | Film Thickness (μm) | Film Retention (%) | Resolution (μm) |
|---|---|---|---|---|---|---|---|
| 4 | A | 700 | 165 | 180 | 14.33 | 62 | 44.55 |
| 5 | B | 400 | 150 | 120 | 0.17 | 0.7 | − |
| 6 | B | 400 | 150 | 240 | 10.24 | 45 | 46.32 |
| 7 | B | 400 | 180 | 120 | 15.33 | 67 | 40.13 |
| 8 | B | 400 | 180 | 240 | 17.64 | 77 | 15.05 |
| 9 | B | 1000 | 150 | 120 | 12.19 | 53 | 52.15 |
| 10 | B | 1000 | 150 | 240 | 15.74 | 68 | 42.59 |
| 11 | B | 1000 | 180 | 120 | 18.25 | 79 | 25.26 |
| 12 | B | 1000 | 180 | 240 | 18.91 | 82 | 19.99 |
| 13 | C | 100 | 165 | 180 | 6.89 | 30 | − |
| 14 | C | 700 | 135 | 180 | 8.67 | 38 | − |
| 15 | C | 700 | 165 | 60 | 7.61 | 33 | − |
| 16 | C | 700 | 165 | 180 | 8.19 | 36 | − |
| 17 | C | 700 | 165 | 180 | 16.62 | 72 | 37.55 |
| 18 | C | 700 | 165 | 180 | 16.64 | 72 | 19.50 |
| 19 | C | 700 | 165 | 180 | 17.31 | 75 | + |
| 20 | C | 700 | 165 | 180 | 17.69 | 77 | 17.72 |
| 21 | C | 700 | 165 | 180 | 18.08 | 79 | 32.97 |
| 22 | C | 700 | 165 | 300 | 19.12 | 83 | 33.22 |
| 23 | C | 700 | 195 | 180 | 25.00 | 100 | 6.02 |
| 24 | C | 1300 | 165 | 180 | 18.43 | 80 | 27.78 |
| 25 | D | 400 | 150 | 120 | 12.12 | 53 | 47.59 |
| 26 | D | 400 | 150 | 240 | 16.02 | 70 | 39.89 |
| 27 | D | 400 | 180 | 120 | 19.10 | 83 | 32.99 |
| 28 | D | 400 | 180 | 240 | 25.00 | 100 | 8.43 |
| 29 | D | 1000 | 150 | 120 | 16.32 | 71 | 43.30 |
| 30 | D | 1000 | 150 | 240 | 18.82 | 82 | 23.53 |
| 31 | D | 1000 | 180 | 120 | 18.74 | 82 | 19.87 |
| 22 | D | 1000 | 180 | 240 | 25.00 | 100 | 5.66 |
| 33 | E | 700 | 165 | 180 | 19.07 | 83 | 21.79 |

− Denotes a value not measurable due to poor image quality and + denotes a value not measured.

Examples 34–38

Resin B (60.21 parts), 29.79 parts of Crosslinking Agent B, and 9.00 parts of mesitylene were combined in an amber bottle. Catalyst D (1.00 part) was added to the blend and mixing was continued for 0.5 h at room temperature. The mixture was then pressure-filtered (138 to 276 kPa nitrogen) through a stainless steel canister containing 10-μm and 5-μm nylon membranes in series. The silicone composition (filtrate) was stored prior to use at −15° C. in a closed polyethylene bottle wrapped in aluminum foil.

In each of Examples 34–38, the silicone composition (about 2.5 g), which was at room temperature, was applied to a 100-mm silicon wafer and spun out into a thin film. The wafers were spun at 500 rpm for 10 s (Examples 34 and 36–38) or 25 s (Example 35), followed by 1500 rpm for 20 s. The coated wafer was heated on a hot plate at 100° C. for 2 min to remove most of the solvent. The film was then exposed to I-line radiation (365 nm) through a photomask containing 250-μm circular apertures and in near contact with the film. The wafer was then heated on a hot plate under the conditions of temperature and time specified in Table 3. The wafer was allowed to cool to room temperature and mounted on a spin coater. The coated surface of the wafer was flooded with n-butyl ether and allowed to stand at room temperature for 1 min (Examples 34 and 35) or 0.1 min (Examples 36–38). The wafer was then spun dry (200 rpm for 30 s followed by 3000 rpm for 30 s), placed in an oven for 30 min at 200° C., and allowed to cool to room temperature. The film thickness, film retention, and resolution values for each wafer are reported in Table 3.

TABLE 3

| Example | Catalyst | Dose (mJ/cm$^2$) | Post. UV Temp. (° C.) | Bake Time (s) | Film Thickness (μm) | Film Retention (%) | Resolution (μm) |
| --- | --- | --- | --- | --- | --- | --- | --- |
| 34 | D | 981.5 | 130 | 30 | 7.6 | 88 | 500 |
| 35 | D | 981.5 | 130 | 60 | 10.8 | – | 500 |
| 36 | D | 981.5 | 130 | 15 | 7.3 | 85 | 250 |
| 37 | D | 226.5 | 130 | 30 | 7.2 | 84 | 500 |
| 38 | D | 981.5 | 130 | 30 | 7.9 | 92 | 500 |

+ Denotes a value not measured

That which is claimed is:

1. A method of preparing a planar optical waveguide assembly, comprising the steps of:
   (i) applying a curable polymer composition to a surface of a substrate to form a polymer film;
   (ii) curing the polymer film to form a lower clad layer;
   (iii) applying a silicone composition to the lower clad layer to form a silicone film, wherein the silicone composition comprises:
      (A) an organopolysiloxane containing an average of at least two silicon-bonded alkenyl groups per molecule,
      (B) an organosilicon compound containing an average of at least two silicon-bonded hydrogen atoms per molecule in a concentration sufficient to cure the composition, and
      (C) a catalytic amount of a photoactivated hydrosilylation catalyst;
   (iv) exposing at least one selected region of the silicone film to radiation having a wavelength of from 150 to 800 nm to produce a partially exposed film having at least one exposed region and at least one non-exposed region;
   (v) removing the non-exposed region of the partially exposed film with a developing solvent to form a patterned film; and
   (vi) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core.

2. The method according to claim 1, wherein the curable polymer composition is a curable silicone composition.

3. The method according to claim 2, wherein the curable silicone composition is the silicone composition in step (iii).

4. The method according to claim 1, wherein the substrate is silicon or silicon dioxide.

5. The method according to claim 1, wherein the lower clad layer has a thickness of from 5 to 200 μm.

6. The method according to claim 1, wherein the organopolysiloxane is an organopolysiloxane resin.

7. The method according to claim 6, wherein the organopolysiloxane resin consists essentially of $R^2{}_3SiO_{1/2}$ units and $R^1SiO_{3/2}$ units, wherein the mole ratio of $R^2{}_3SiO_{1/2}$ units to $R^1SiO_{3/2}$ units is from 0.05 to 1.0, each $R^1$ is independently selected from hydrocarbyl, deuterium-substituted hydrocarbyl, and halogen-substituted hydrocarbyl, all free of aliphatic unsaturation, and $R^2$ is $R^1$ or alkenyl.

8. The method according to claim 7, wherein the organopolysiloxane resin consists essentially of $PhSiO_{3/2}$ units and $CH_2\!\!=\!\!CH(CH_3)_2SiO_{1/2}$ units.

9. The method according to claim 1, wherein the photoactivated hydrosilylation catalyst is a platinum(II) β-diketonate.

10. The method according to claim 9, wherein the platinum (II) β-diketonate is platinum(II) bis(2,4-pentanedioate).

11. The method according to claim 1, wherein the silicone core has a thickness of from 1 to 100 μm.

12. The method according to claim 1, further comprising (vii) covering the lower clad layer and the silicone core with a second curable polymer composition to form a second polymer film and (viii) curing the second polymer film to form an upper clad layer, wherein the upper clad layer has a refractive index less than the refractive index of the silicone core.

13. The method according to claim 12, wherein the second curable polymer composition is a curable silicone composition.

14. The method according to claim 13, wherein the curable silicone composition is the silicone composition in step (iii).

15. The method according to claim 12, wherein the upper clad layer has a thickness of from 5 to 200 μm.

16. A method of preparing a planar optical waveguide assembly, comprising the steps of:
   (i) applying a curable polymer composition to a surface of a substrate to form a polymer film;
   (ii) curing the polymer film to form a lower clad layer;
   (iii) applying a silicone composition to the lower clad layer to form a silicone film, wherein the silicone composition comprises:

(A) an organopolysiloxane containing an average of at least two silicon-bonded alkenyl groups per molecule,
(B) an organosilicon compound containing an average of at least two silicon-bonded hydrogen atoms per molecule in a concentration sufficient to cure the composition, and
(C) a catalytic amount of a photoactivated hydrosilylation catalyst;

(iv) exposing at least one selected region of the silicone film to radiation having a wavelength of from 150 to 800 nm to produce a partially exposed film having at least one exposed region and at least one non-exposed region;

(v) heating the partially exposed film for an amount of time such that the exposed region is substantially insoluble in a developing solvent and the non-exposed region is soluble in the developing solvent;

(vi) removing the non-exposed region of the heated film with the developing solvent to form a patterned film; and (vii) heating the patterned film for an amount of time sufficient to form at least one silicone core having a refractive index of from 1.3 to 1.7 at 23° C. for light having a wavelength of 589 nm; wherein the lower clad layer has a refractive index less than the refractive index of the silicone core.

17. The method according to claim 16, wherein the curable polymer composition is a curable silicone composition.

18. The method according to claim 17, wherein the curable silicone composition is the silicone composition in step (iii).

19. The method according to claim 16, wherein the substrate is silicon or silicon dioxide.

20. The method according to claim 16, wherein the lower clad layer has a thickness of from 5 to 200 μm.

21. The method according to claim 16, wherein the organopolysiloxane is an organopolysiloxane resin.

22. The method according to claim 21, wherein the organopolysiloxane resin consists essentially of $R^2_3SiO_{1/2}$ units and $R^1SiO_{3/2}$ units, wherein the mole ratio of $R^2_3SiO_{1/2}$ units to $R^1SiO_{3/2}$ units is from 0.05 to 1.0, each $R^1$ is independently selected from hydrocarbyl, deuterium-substituted hydrocarbyl, and halogen-substituted hydrocarbyl, all free of aliphatic unsaturation, and $R^2$ is $R^1$ or alkenyl.

23. The method according to claim 22, wherein the organopolysiloxane resin consists essentially of $PhSiO_{3/2}$ units and $CH2=CH(CH_3)_2SiO_{1/2}$ units.

24. The method according to claim 16, wherein the photoactivated hydrosilylation catalyst is a platinum(II) β-diketonate.

25. The method according to claim 24, wherein the platinum (II) β-diketonate is platinum(II) bis(2,4-pentanedioate).

26. The method according to claim 16, wherein the partially exposed film is heated at a temperature of from 50 to 250° C. for 0.1 to 10 min.

27. The method according to claim 16, wherein the silicone core has a thickness of from 1 to 100 μm.

28. The method according to claim 16, further comprising (viii) covering the lower clad layer and the silicone core with a second curable polymer composition to form a second polymer film and (ix) curing the second polymer film to form an upper clad layer, wherein the upper clad layer has a refractive index less than the refractive index of the silicone core.

29. The method according to claim 28, wherein the second curable polymer composition is a curable silicone composition.

30. The method according to claim 29, wherein the curable silicone composition is the silicone composition in step (iii).

31. The method according to claim 28, wherein the upper clad layer has a thickness of from 5 to 200 μm.

* * * * *